United States Patent
Tsumura

[11] Patent Number: 5,883,553
[45] Date of Patent: Mar. 16, 1999

[54] FILTER UNIT ADAPTED FOR MINIATURIZATION AND FOR SELECTING A PARTICULAR SIGNAL WHERE A PLURALITY OF SIGNALS DIFFERENT IN BANDWIDTH COEXIST

[75] Inventor: Soichi Tsumura, Tokyo, Japan

[73] Assignee: NEC Corporation, Tokyo, Japan

[21] Appl. No.: 921,474

[22] Filed: Sep. 2, 1997

[30] Foreign Application Priority Data

Sep. 2, 1996 [JP] Japan .................................. 8-231599

[51] Int. Cl.$^6$ .............................. H03H 7/00; H04B 1/16
[52] U.S. Cl. ...................... 333/174; 333/175; 455/209; 455/323
[58] Field of Search .................................... 333/167, 173, 333/175, 174, 125, 126, 129, 132, 134, 136; 455/209, 207, 208, 307, 314, 323

[56] References Cited

U.S. PATENT DOCUMENTS 5,390,346  2/1995  Marz .................................. 455/209 X
5,561,406  10/1996  Ikata et al. .............................. 333/126

FOREIGN PATENT DOCUMENTS

0299578    1/1989   European Pat. Off. .
60-223304  11/1985  Japan .
3-175808    7/1991  Japan ...................................... 333/32
5-327403   12/1993  Japan ...................................... 333/32
2233520     1/1991  United Kingdom .................. 455/314

*Primary Examiner*—Seungsook Ham
*Attorney, Agent, or Firm*—Sughrue, Mion, Zinn, Macpeak & Seas, PLLC

[57] ABSTRACT

In a filter unit having a first and a second bandpass filter (21 and 22) and an input terminal (101) supplied with a unit input signal, the first bandpass filter has a first filtering bandwidth with a first center frequency while a second bandpass filter having a second filtering bandwidth with a second center frequency. Only when the unit input signal has a bandwidth similar to the first filtering bandwidth, a first impedance-adjusting arrangement (11 and 31) matches a first impedance of a combination of the first bandpass filter and the first impedance-adjusting arrangement with an output impedance of an input side component. Only when the unit input signal has a bandwidth similar to the second filtering bandwidth, a second impedance-adjusting arrangement (12 and 32) matches a second impedance of a combination of the second bandpass filter and the second impedance-adjusting arrangement with the output impedance of the input side component.

5 Claims, 6 Drawing Sheets

FILTER UNIT ADAPTED FOR MINIATURIZATION AND FOR SELECTING A PARTICULAR SIGNAL WHERE A PLURALITY OF SIGNALS DIFFERENT IN BANDWIDTH COEXIST

BACKGROUND OF THE INVENTION

This invention relates to a filter unit and a frequency conversion filter for use in selecting a particular signal in a situation where a plurality of signals different in bandwidth coexist and a common frequency band is shared.

A filter unit of the type is used, in a situation where a plurality of signals different in bandwidth coexist as input signals and a common frequency band is shared, to select a target signal after conversion of frequencies of the input signals into specific intermediate frequencies, respectively.

Figure 1:
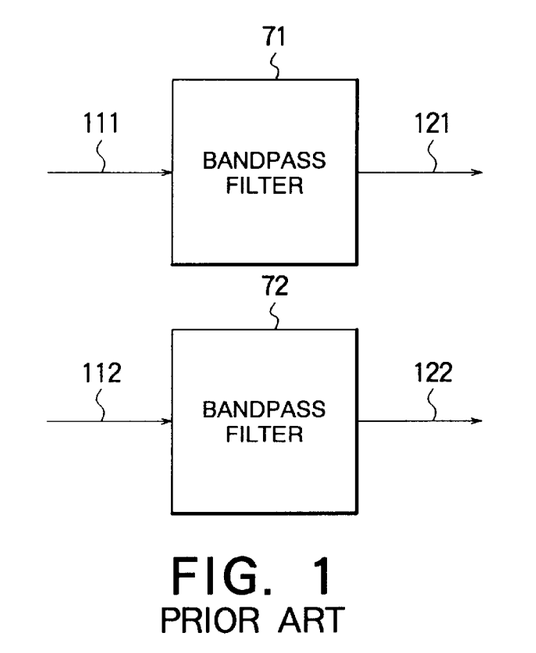
FIG. 1 is a schematic block diagram of a conventional filter unit.

Referring to FIG. 1, description will be made as regards a conventional filter unit. In the conventional filter unit, input signals 111 and 112 are converted to have a same intermediate frequency and supplied to bandpass filters 71 and 72 different in filtering bandwidth from each other to produce output signals 121 and 122.

In the conventional filter unit of FIG. 1, however, the bandpass filters 71 and 72 are different in filtering bandwidth from each other. Therefore, either one of them alone can not be used in common to all input signals. In addition, the bandpass filters 71 and 72 has a same center frequency. Accordingly, if their inputs as well as their outputs are simply connected, it is not possible to assure attenuation characteristics of the bandpass filters narrow in filtering bandwidth. Therefore, the input and the output signals of the plurality of filters different in bandwidth from each other must be independent from each other. This requires blocks to be provided outside of the filter in order to separate the input signals as well as the output signals. Thus, miniaturization is difficult to achieve.

Figure 2:
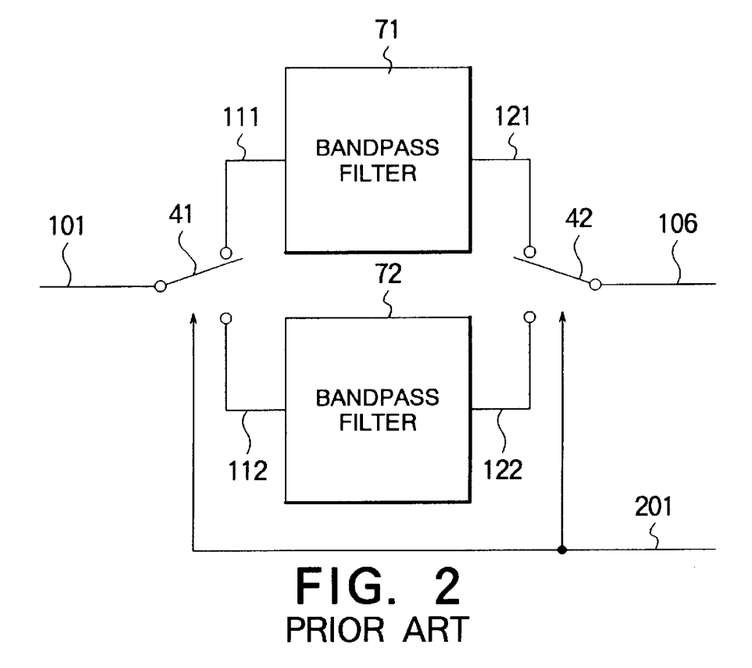
FIG. 2 is a schematic block diagram of another conventional filter unit.

Referring to FIG. 2, the description will be made as regards another conventional filter unit. In the conventional filter unit, the input signals 111 and 112 are supplied in common to a selection switch 41 while the output signals 121 and 122 of the filter are connected in common to a selection switch 42. The selection switches 41 and 42 are switched by a selection control signal 201 on demand to select one of the bandpass filters which has a filtering bandwidth corresponding to a target signal. A reference numeral 101 represents a signal supplied to the filter while a reference numeral 106 represents a signal produced from the filter. The above-described conventional example is also led from a band split filter disclosed in JP-A 60-223304.

In the conventional filter unit of FIG. 2, the selection switches 41 and 42 are formed by active elements. In particular, if a relatively high frequency of several MHz or more is selected as the intermediate frequency, the bandpass filters 71 and 72 are generally formed by passive elements. Therefore, if all those components are accommodated in a same package for the purpose of miniaturization, sufficient miniaturization is difficult. Besides, there arises another problem of the increase in cost resulting from various factors such as the increase in the number of steps.

SUMMARY OF THE INVENTION

It is therefore an object of this invention to provide a filter unit which is adapted for miniaturization and which is for selecting a particular signal in a situation where a plurality of signals different in bandwidth coexist.

It is another object of this invention to provide a frequency conversion filter which is adapted for miniaturization and which is for selecting a particular signal in a situation where a plurality of signals different in bandwidth coexist and a common frequency band is shared.

Other objects of this invention will become clear as the description proceeds.

According to this invention, there is provided a filter unit comprising an input terminal supplied with a unit input signal from an input side component, a first bandpass filter having a first filtering bandwidth with a first center frequency, a second bandpass filter having a second filtering bandwidth with a second center frequency, first impedance-adjusting means connected to the input terminal and the first bandpass filter for adjusting a first impedance of a combination of the first bandpass filter and the first impedance-adjusting means to match the first impedance with an output impedance of the input side component when the unit input signal has a bandwidth similar to the first filtering bandwidth and has a center frequency similar to the first center frequency, the first impedance mismatching with the output impedance of the input side component when the unit input signal has a bandwidth similar to the second filtering bandwidth and has a center frequency similar to the second center frequency, and second impedance-adjusting means connected to the input terminal and the second bandpass filter for adjusting a second impedance of a combination of the second bandpass filter and the input impedance-adjusting means to match the second impedance with the output impedance of the input side component when the unit input signal has a bandwidth similar to the second filtering bandwidth and has a center frequency similar to the second center frequency, the second impedance mismatching with the output impedance of the input side component when the unit input signal has a bandwidth similar to the first filtering bandwidth and has a center frequency similar to the first center frequency.

According to this invention, there is further provided a frequency conversion filter for use in selecting a particular signal in a situation where a plurality of filter input signals different in bandwidth coexist and a common frequency band is shared. The frequency conversion filter comprises a zeroth bandpass filter supplied with the filter input signals for filtering the filter input signals into a filtered signal, a first frequency converter section connected to the zeroth bandpass filter for frequency-converting the filtered signal into a first converted signal, a filter unit connected to the first frequency converter and supplied with the first converted signal as a unit input signal for processing the unit input signal into a unit output signal, a second frequency converter section connected to the filter unit for frequency-converting the unit output signal into a first converted signal, and a frequency setting section connected to the first and the second frequency converter sections for controlling the first frequency converter section so that a center frequency of an input signal supplied to the first frequency converter section is converted into one of the first and the second center frequencies of the first and the second bandpass filters included in the filter unit and for controlling the second frequency converter section so that, whichever center frequency of any bandpass filter results from the frequency conversion, the center frequency after the conversion is further subjected to frequency conversion into a predetermined specific frequency. The filter unit comprises an input terminal connected to the first frequency converter section and supplied with the unit input signal from the first frequency converter section, an output terminal connected to the second frequency converter section for supplying the unit output signal from the first frequency converter to the second frequency converter section, a first bandpass filter having a first filtering bandwidth with a first center frequency, a second bandpass filter having a second filtering bandwidth with a second center frequency, first impedance-adjusting means connected to the input terminal, the output terminal, and the first bandpass filter for adjusting a first impedance of a combination of the first bandpass filter and the first impedance-adjusting means to match the first impedance with an output impedance of the first frequency converter when the unit input signal has a bandwidth similar to the first filtering bandwidth and has a center frequency similar to the first center frequency, the first impedance mismatching with the output impedance of the first frequency converter when the unit input signal has a bandwidth similar to the second filtering bandwidth and has a center frequency similar to the second center frequency, and second impedance-adjusting means connected to the input terminal and the second bandpass filter for adjusting a second impedance of a combination of the second bandpass filter and the input impedance-adjusting means to match the second impedance with the output impedance of the first frequency converter when the unit input signal has a bandwidth similar to the second filtering bandwidth and has a center frequency similar to the second center frequency, the second impedance mismatching with the output impedance of the first frequency converter when the unit input signal has a bandwidth similar to the first filtering bandwidth and has a center frequency similar to the first center frequency.

DESCRIPTION OF THE PREFERRED EMBODIMENTS

Now, description will be made about embodiments of this invention with reference to the drawing.

Figure 3:
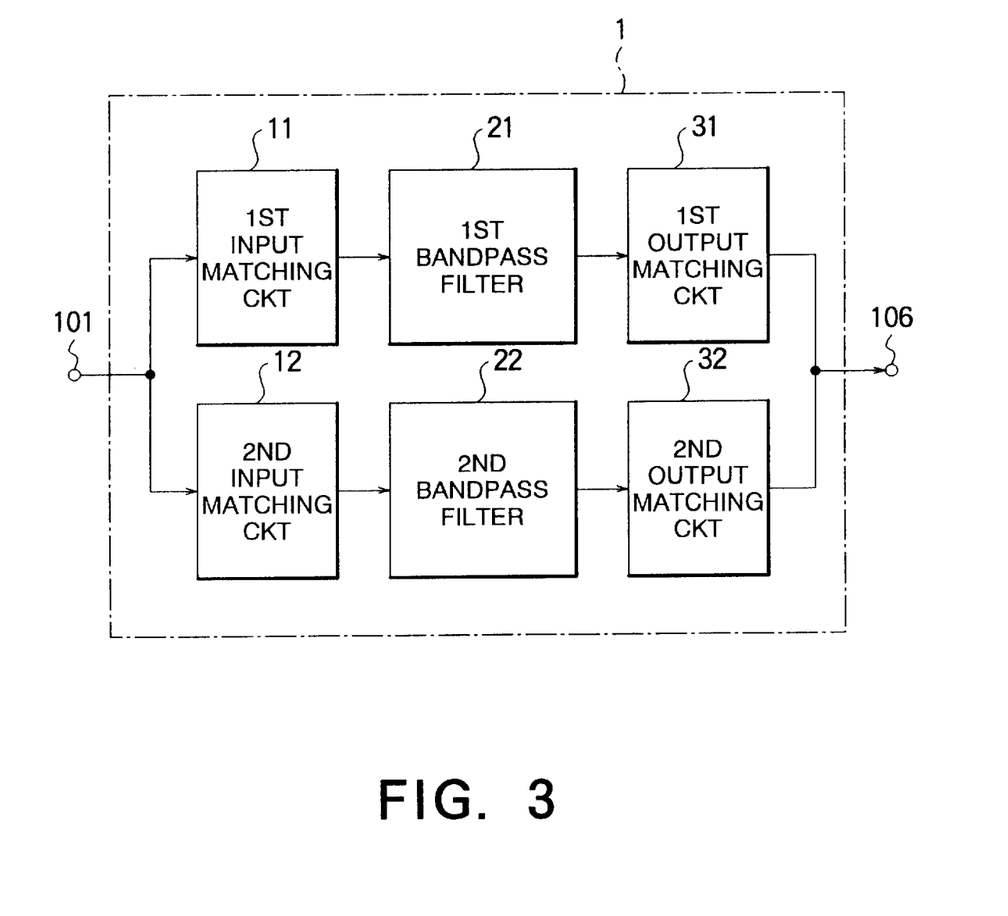
FIG. 3 is a schematic block diagram of a filter unit according to a first embodiment of this invention.

Referring to FIG. 3, the description will be directed to a filter unit according to a first embodiment of this invention. The filter unit is designated by a reference numeral 1 and comprises an input terminal 101, a first input matching circuit 11, a second input matching circuit 12, a first bandpass filter 21, a second bandpass filter 22, a first output matching circuit 31, a second output matching circuit 32, and an output terminal 106.

The input terminal 101 is connected to an input side component (not shown) and is supplied as a unit input signal from the input side component with a plurality of signals different in bandwidth coexist. The first input matching circuit 11 is connected between the input terminal 101 and the first bandpass filter 21. The second input matching circuit 12 is connected between the input terminal 101 and the second bandpass filter 22. The first output matching circuit 31 is connected between the first bandpass filter 21 and the output terminal 106. The second output matching circuit 32 is connected between the second bandpass filter 22 and the unit output terminal 106. A combination of the first input and the first output matching circuits 11 and 31 is referred to as a first impedance-adjusting arrangement. A combination of the second input and the second output matching circuits 12 and 32 is referred to as a second impedance-adjusting arrangement.

Each of the first and the second bandpass filters 21 and 22 comprises passive elements alone and are different in filtering bandwidth characteristic and center frequency from each other. It is assumed here that the first bandpass filter 21 has a first filtering bandwidth d1 with a first center frequency f1 while the second bandpass filter 22 has a second filtering bandwidth d2 with a second center frequency f2. An absolute value $|f1-f2|$ of a frequency difference between the first and the second center frequencies f1 and f2 is assumed to be sufficiently greater than the first and the second filtering bandwidths d1 and d2.

An impedance of the first bandpass filter 21 as seen from the first input and the first output matching circuits 11 and 31 is designed to be a specific characteristic impedance in the vicinity of the first filtering bandwidth d1 around the first center frequency f1 and to be an extremely high impedance substantially equivalent to that in a released state in the vicinity of the second filtering bandwidth d2 around the second center frequency f2. In other words, the first impedance-adjusting arrangement is for adjusting a first impedance of a combination of the first bandpass filter 21 and the first impedance-adjusting arrangement to match the first impedance with an output impedance of the input side component when the unit input signal has a bandwidth similar to the first filtering bandwidth d1 and has a center frequency similar to the first center frequency f1. Otherwise, the first impedance mismatches with the output impedance of the input side component. More particularly, the first impedance becomes higher than the output impedance of the input side component when the unit input signal has a bandwidth similar to the second filtering bandwidth d2 and has a center frequency similar to the second center frequency f2.

An impedance of the second bandpass filter 22 as seen from the second input and the second output matching circuits 12 and 32 is designed to be a specific characteristic impedance in the vicinity of the second filtering bandwidth d2 around the second center frequency f2 and to be an extremely high impedance substantially equivalent to that in a released state in the vicinity of the first filtering bandwidth d1 around the first center frequency f1. In other words, the second impedance-adjusting arrangement is for adjusting a second impedance of a combination of the second bandpass filter 22 and the second impedance-adjusting arrangement to match the second impedance with the output impedance of the input side component when the unit input signal has a bandwidth similar to the second filtering bandwidth d2 and has a center frequency similar to the second center frequency f2. Otherwise, the second impedance mismatches with the output impedance of the input side component. More particularly, the second impedance becomes higher than the output impedance of the input side component when the unit input signal has a bandwidth similar to the first filtering bandwidth d1 and has a center frequency similar to the first center frequency f1.

By designing the impedances as described above, it is possible to directly connect input sides of the first and the second input matching circuits 11 and 12 as well as output sides of the first and the second output matching circuits 31 and 32.

Since all these components can be formed by passive elements alone, this structure is effective in miniaturization by accommodation in a same package.

Figure 4:
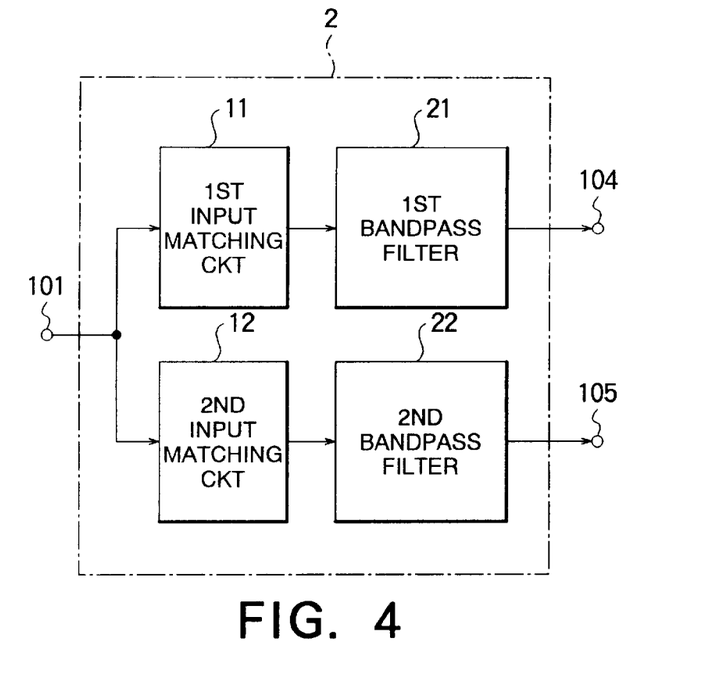
FIG. 4 is a schematic block diagram of a filter unit according to a second embodiment of this invention.

Referring to FIG. 4, the description will be directed to a filter unit according to a second embodiment of this invention. Similar parts are designated by like reference numerals. The filter unit of FIG. 4 is designated by a reference numeral 2 and further comprises first and second output terminals 104 and 105 directly connected to the first and the second bandpass filters 21 and 22, respectively. The filter unit is effective in case where outputs of the first and the second bandpass filters 21 and 22 is processed in different forms in the manner known in the art. For example, the output of the first bandpass filter 21 is subjected to frequency detection by a combination of a limiter and a discriminator while the output of the second bandpass filter 21 is subjected to phase detection by a quadrature demodulator. In the filter unit 2, the first input matching circuit 11 is referred to as the first impedance-adjusting arrangement while the second input matching circuit 12 is referred to as the second impedance-adjusting arrangement.

Figure 5:
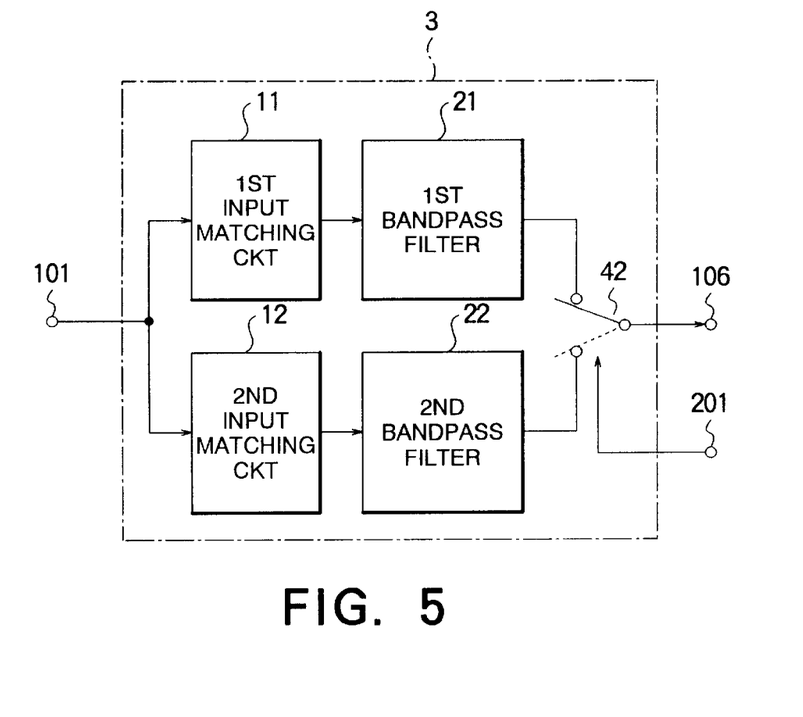
FIG. 5 is a schematic block diagram of a filter unit according to a third embodiment of this invention.

Referring to FIG. 5, the description will be directed to a filter unit according to a third embodiment of this invention. Similar parts are designated by like reference numerals. The filter unit of FIG. 5 is designated by a reference numeral 3 and further comprises a selection switch 42 connected to the output terminal 106 and to output sides of the first and the second bandpass filters 21 and 22 for selecting a selected one of the first and the second bandpass filters 21 and 22 to connect the selected one with the output terminal 106. More particularly, the selection switch 42 alternatively selects outputs of the bandpass filters 21 and 22 in response to a selection control signal supplied through a control terminal 201.

It is assumed here that the selection switch 42 is switched below to deliver the output of the second bandpass filter 22 to the output terminal 106 while the output of the first bandpass filter 21 is released. Let the first bandpass filter 21 has the first filtering bandwidth d1 with the first center frequency f1. In this case, an impedance as seen from the input side of the first input matching circuit 11 can be easily made to be a high impedance equivalent to that in a released state within the first bandwidth d1 around the first center frequency f1, particularly when the bandpass filter 21 has a small insertion loss. The above also applies to the second input matching circuit 12.

The filter unit 3 is therefore effective in case where it is impossible by the above-mentioned filter unit 1 of FIG. 1 to fulfill the impedance setting such that, when each of the first and the second bandpass filters 21 and 22 is seen from the matching circuits, its impedance characteristic is equivalent to that in a released state within the filtering bands of all other bandpass filters while impedance matching is established within the filtering band of the bandpass filter in consideration. In the filter unit 3, a combination of the first input and the first output matching circuits 11 and 31 is referred to as the first impedance-adjusting arrangement while a combination of the second input and the second output matching circuits 12 and 32 is referred to as a second impedance-adjusting arrangement.

Figure 6:
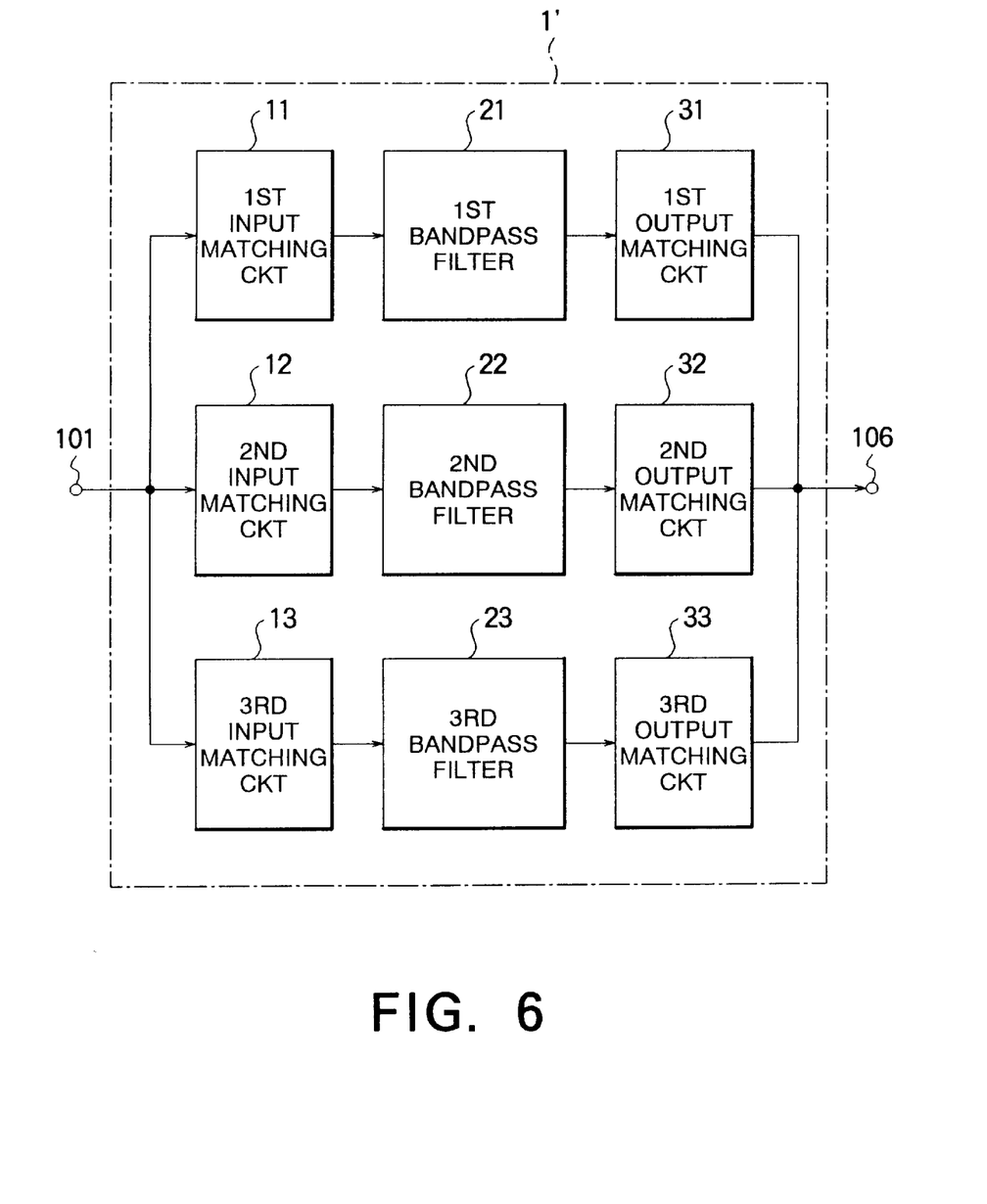
FIG. 6 is a schematic block diagram of a modification of the filter unit of FIG. 3.

Referring to FIG. 6, the description will be directed to a modification of the filter unit 1 of FIG. 3. The modification is designated by a reference numeral 1' and further comprises a third input matching circuit 13 connected to the input terminal 101, a third bandpass filter 23 connected to the third input matching circuit 13, and a third output matching circuit 33 connected between the third bandpass filter 23 and the output terminal 106.

The third bandpass filter 23 has a third filtering bandwidth with a third center frequency. A combination of the third input and the third output matching circuits 13 and 33 is for matching an impedance of a combination of the the third input and the third output matching circuits 13 and 33 and the third bandpass filter 23 with the output impedance of the input side component only when the unit input signal has a bandwidth similar to the third filtering bandwidth.

Figure 7:
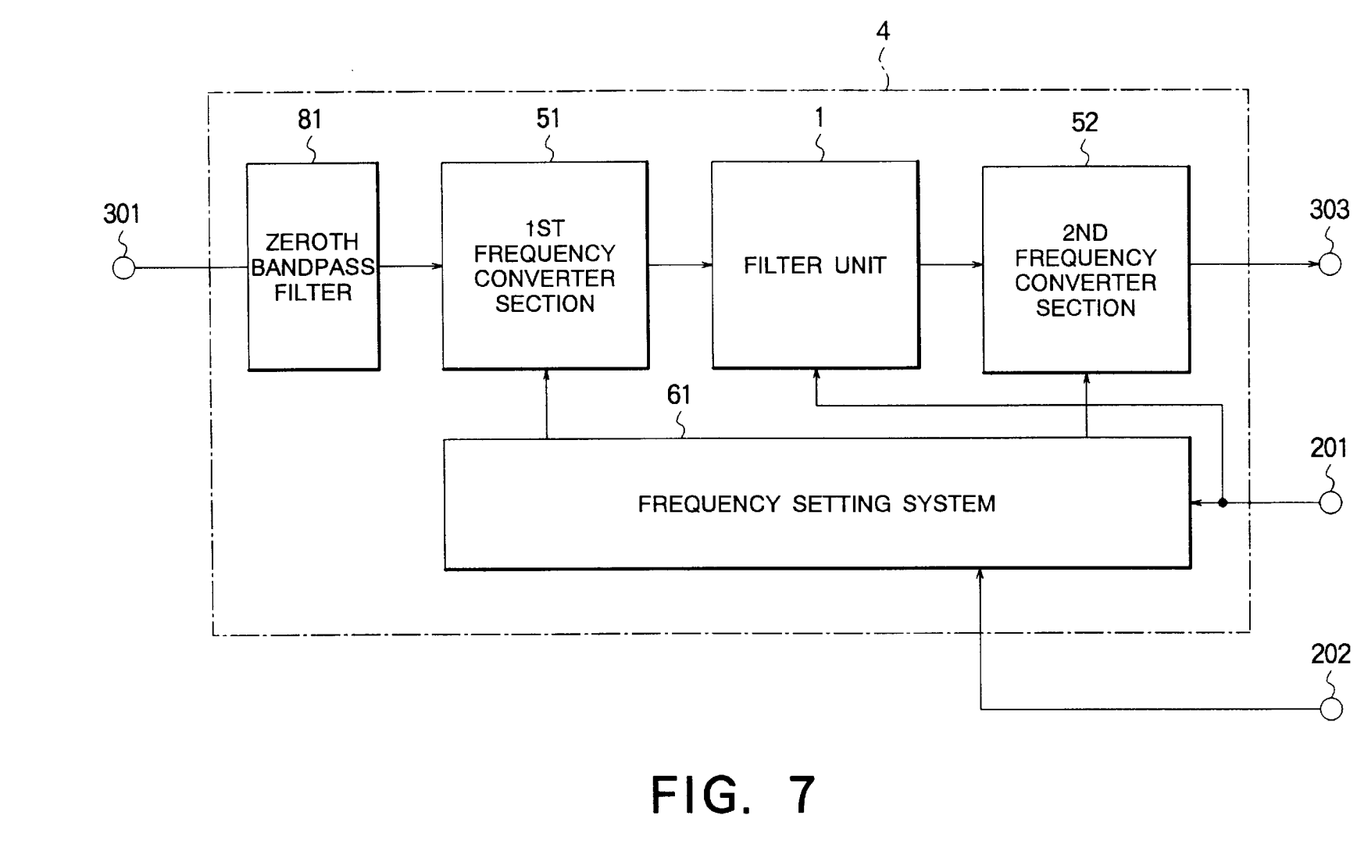
FIG. 7 is a schematic block diagram of a frequency conversion filter according to a fourth embodiment of this invention.

Referring to FIG. 7 together with FIG. 3, the description will be made as regards a frequency conversion filter according to a fourth embodiment of this invention. Similar parts are designated by like reference numerals. The frequency conversion filter is designated by a reference numeral 4 and is for use in selecting a particular signal in a situation where a plurality of filter input signals different in bandwidth coexist and a common frequency band is shared.

The frequency conversion filter 4 comprises a zeroth bandpass filter 81 supplied with the filter input signals for filtering the filter input signals into a filtered signal, a first frequency converter section 51 connected to the zeroth bandpass filter 81 for frequency-converting the filtered signal into a first converted signal, the above-mentioned filter unit 1 connected to the first frequency converter for processing the first converted signal into a processed signal, a second frequency converter section 52 connected to the first and the second output matching circuits 11 and 31 of the filter unit 1 for frequency-converting the filtered signal into a second converted signal, and a frequency setting section 61 connected to the first and the second frequency converter sections 51 and 52 for setting a frequency in the following description.

The frequency setting section 61 controls the first frequency converter section 51 so that a center frequency of the filtered signal is converted into one of the first and the second center frequencies f1 and f2. The frequency setting section 61 further controls the second frequency converter section 52 so that, whichever center frequency of any bandpass filter results from the frequency conversion, the center frequency after the conversion is further subjected to frequency conversion into a predetermined specific frequency.

More particularly, the description will be made as the frequency conversion filter 4. The filter input signal is supplied through an input terminal 301 to the zeroth bandpass filter 81 to attenuate a superfluous signal component except the common frequency band being shared. Thereafter, a resultant signal is converted by the first frequency converter section 51 into either one of the first and the second center frequencies f1 and f2 of bandpass filters 21 and 22 contained in the filter unit 1 described in conjunction with FIG. 3. After passage through the filter unit 1, frequency conversion is carried out by the second frequency converter section 52. At this time, under control of the frequency setting section 61, the frequency conversion is carried out into a predetermined specific frequency, whichever frequency results from the conversion by the first frequency converter section 51.

In the following, for convenience of description, let the frequency band shared by the filter input signal be represented by drf. Each of the first and the second frequency converter sections 51 and 52 is of a mixer type.

It is assumed here that the filter input signal has a center frequency fc and a bandwidth d1. Since a frequency of the bandwidth d1 around the center frequency fc is contained in the frequency band drf, the filter input signal is not substantially attenuated by the zeroth bandpass filter 81 to produce a signal which is supplied to the first frequency converter section 51. Then, the signal is frequency-converted by the first frequency converter section 51 into the center frequency f1 and filtered by the first bandpass filter 21 to produce the unit output signal from the filter unit 1. Subsequently, the unit output signal is frequency-converted by the second frequency converter section 52 into a predetermined specific frequency as a filter output signal which is supplied to an output terminal 303. The first and the second frequency converter sections 51 and 52 are controlled by the frequency setting section 61. In response to a selection control signal supplied through a first additional terminal 201, the frequency setting section 61 controls which bandpass filter in FIG. 3 is to be used in filtering. In response to a frequency setting signal supplied through a second additional terminal 202, the frequency setting section 61 determines the center frequency of a filter input signal.

In case where the filtering is carried out by the use of the first bandpass filter 21 in FIG. 3, if the filter input signal includes a signal component of a frequency fc−f1+f2, this signal component is produced as the signal 106 through the second bandpass filter 22 in FIG. 3. In case where the filtering is carried out by the use of the second bandpass filter 22, if the filter input signal includes a signal component of a frequency fc−f1+f2, this signal component is produced as the unit output signal of the filter unit 1 through the first bandpass filter 21. Therefore, these frequency components must be sufficiently attenuated by the zeroth bandpass filter 81.

Figure 8:
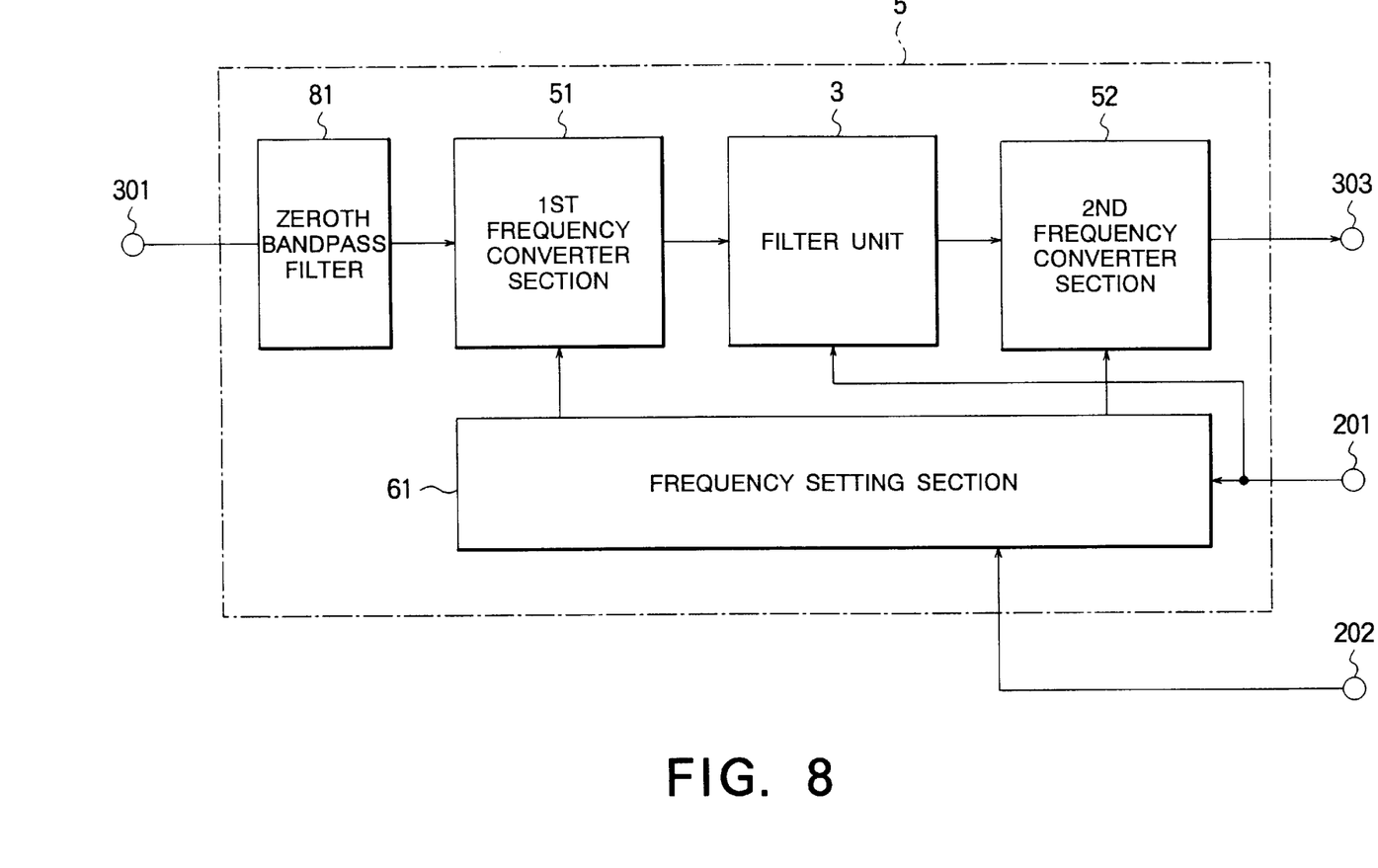
FIG. 8 is a schematic block diagram of a frequency conversion filter according to a fifth embodiment of this invention.

Referring to FIG. 8 together with FIG. 5, the description will be made as regards a frequency conversion filter according to a fifth embodiment of this invention. Similar parts are designated by like reference numerals. The frequency conversion filter is designated by a reference numeral 5. In the frequency conversion filter 5, use is made of the filter unit 3 of FIG. 5 instead of the filter unit 1 of FIG. 1.

While this invention ;has thus far been described in conjunction with a few embodiments thereof, it will readily be possible for those skilled in the art to put this invention into practice in various other manners. For example, the filter unit may comprises four or more bandpass filters. The second frequency converter section may be implemented by a quadrature demodulator and a local oscillator.

The entire disclosure of Japanese Patent Application No. 8-231599 filed on Sep. 2, 1996 including specification, claims, drawings and summary are incorporated herein by reference in its entirety.

What is claimed is:

1. A frequency conversion filter for use in selecting a particular signal in a situation where a plurality of filter input signals different in bandwidth coexist and a common frequency band is shared, said frequency conversion filter comprising:
   a zeroth bandpass filter supplied with said filter input signals for filtering said filter input signals into a filtered signal;
   a first frequency converter section connected to said zeroth bandpass filter for frequency-converting said filtered signal into a first converted signal;
   a filter unit connected to said first frequency converter and supplied with said first converted signal as a unit input signal for processing said unit input signal into a unit output signal;
   a second frequency converter section connected to said filter unit for frequency-converting said unit output signal into a second converted signal; and
   a frequency setting section connected to said first and said second frequency converter sections for controlling said first frequency converter section so that a center frequency of an input signal supplied to said first frequency converter section is converted into one of the first and the second center frequencies of the first and the second bandpass filters included in said filter unit and for controlling said second frequency converter section so that the center frequency after the conversion is further subjected to an additional frequency conversion into a predetermined frequency,
   said filter unit comprising:
      an input terminal connected to said first frequency converter section and supplied with said unit input signal from said first frequency converter section;
      an output terminal connected to said second frequency converter section for supplying said unit output signal from said first frequency converter to said second frequency converter section;
      a first bandpass filter having a first filtering bandwidth with a first center frequency;
      a second bandpass filter having a second filtering bandwidth with a second center frequency;
      first impedance-adjusting means connected to said input terminal, said output terminal, and said first bandpass filter for adjusting a first impedance of a combination of said first bandpass filter and said first impedance-adjusting means to match said first impedance with an output impedance of said first frequency converter when said unit input signal has a bandwidth substantially equal to said first filtering bandwidth and has a center frequency substantially equal to said first center frequency, said first impedance mismatching with said output impedance of the first frequency converter when said unit input signal has a bandwidth substantially equal to said second filtering bandwidth and has a center frequency substantially equal to said second center frequency; and
      second impedance-adjusting means connected to said input terminal and said second bandpass filter for adjusting a second impedance of a combination of said second bandpass filter and said input impedance-adjusting means to match said second impedance with said output impedance of the first frequency converter when said unit input signal has a bandwidth substantially equal to said second filtering bandwidth and has a center frequency substantially equal to said second center frequency, said second impedance mismatching with said output impedance of the first frequency converter when said unit input signal has a bandwidth substantially equal to said first filtering bandwidth and has a center frequency substantially equal to said first center frequency.

2. A filter unit as claimed in claim 1, wherein said first impedance becomes higher than said output impedance of the first frequency converter section when said unit input signal has a bandwidth substantially equal to said second filtering bandwidth and has a center frequency substantially equal to said second center frequency, said second impedance becoming higher than said output impedance of the first frequency converter section when said unit input signal has a bandwidth substantially equal to said first filtering bandwidth and has a center frequency similar to said first center frequency.

3. A frequency conversion filter as claimed in claim 1, wherein said first impedance-adjusting means comprises:

a first input matching circuit connected between said input terminal and said first bandpass filter; and a first output matching circuit connected between said output terminal and said first bandpass filter, said second impedance-adjusting means comprising:

a second input matching circuit connected between said input terminal and said second bandpass filter; and a second output matching circuit connected between said output terminal and said second bandpass filter.

4. A filter unit as claimed in claim 3, wherein said first impedance-adjusting means further adjusts said first impedance to match an input impedance of said second frequency converter section, said second impedance-adjusting means further adjusting said second impedance to match said input impedance of the second frequency converter section.

5. A frequency conversion filter as claimed in claim 1, wherein said filter unit further comprises a selection switch connected to said output terminal and to output sides of said first and said second bandpass filters for selecting a selected one of said first and said second bandpass filters to connect said selected one with said output terminal, said first impedance-adjusting means comprising a first input matching circuit connected between said input terminal and said first bandpass filter, said second impedance-adjusting means comprising a second input matching circuit connected between said input terminal and said second bandpass filter.

* * * * *